(12) United States Patent
Lin

(10) Patent No.: US 9,711,678 B2
(45) Date of Patent: *Jul. 18, 2017

(54) LIGHT-EMITTING DEVICE

(71) Applicant: EPISTAR CORPORATION, Hsinchu (TW)

(72) Inventor: Yi-Chieh Lin, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/051,712

(22) Filed: Feb. 24, 2016

(65) Prior Publication Data

US 2016/0233376 A1 Aug. 11, 2016

Related U.S. Application Data

(63) Continuation of application No. 14/618,037, filed on Feb. 10, 2015, now Pat. No. 9,306,115.

(51) Int. Cl.
| | |
|---|---|
| *H01L 33/26* | (2010.01) |
| *H01L 33/00* | (2010.01) |
| *H01L 33/06* | (2010.01) |
| *H01L 33/30* | (2010.01) |
| *H01L 33/12* | (2010.01) |
| *H01L 33/38* | (2010.01) |

(52) U.S. Cl.
CPC .......... *H01L 33/0025* (2013.01); *H01L 33/06* (2013.01); *H01L 33/12* (2013.01); *H01L 33/26* (2013.01); *H01L 33/30* (2013.01); *H01L 33/38* (2013.01)

(58) Field of Classification Search
CPC ..... H01L 33/0025; H01L 33/06; H01L 33/12; H01L 33/26; H01L 33/30
See application file for complete search history.

(56) References Cited

U.S. PATENT DOCUMENTS

| | | | |
|---|---|---|---|
| 5,561,301 A | 10/1996 | Inoue | |
| 5,937,273 A | 8/1999 | Fujii et al. | |
| 6,034,983 A | 3/2000 | Fujii et al. | |
| 8,405,065 B2 | 3/2013 | Gronninger et al. | |
| 2001/0026571 A1 | 10/2001 | Hayakawa | |
| 2003/0071265 A1* | 4/2003 | Thompson | B82Y 20/00 257/79 |
| 2003/0091082 A1* | 5/2003 | Fukunaga | B82Y 20/00 372/45.011 |
| 2003/0122134 A1 | 7/2003 | Hirukawa | |
| 2004/0017835 A1* | 1/2004 | Jewell | B82Y 20/00 372/45.012 |
| 2004/0066818 A1 | 4/2004 | Yamamoto et al. | |
| (Continued) | | | |

*Primary Examiner* — Allan R Wilson

(74) *Attorney, Agent, or Firm* — Ditthavong & Steiner, P.C.

(57) ABSTRACT

A light-emitting device is provided. The light-emitting device comprises: a substrate; and an active structure on the substrate, the active structure comprising a well layer and a barrier layer, wherein the well layer comprises multiple different elements of group VA; wherein the substrate has a first intrinsic lattice constant, the well layer has a second intrinsic lattice constant, the barrier layer has a third intrinsic lattice constant, and the third intrinsic lattice constant is between the second intrinsic lattice constant and the first intrinsic lattice constant.

20 Claims, 6 Drawing Sheets

(56) References Cited

U.S. PATENT DOCUMENTS

| | | |
|---|---|---|
| 2004/0075095 A1* | 4/2004 | Shakuda ............... H01L 33/02 257/79 |
| 2004/0161006 A1* | 8/2004 | Chang ................... B82Y 20/00 372/45.011 |
| 2004/0218645 A1 | 11/2004 | Hirukawa et al. |
| 2005/0173694 A1 | 8/2005 | Mawst et al. |
| 2005/0201439 A1 | 9/2005 | Horie |
| 2009/0302307 A1* | 12/2009 | Gronninger ........... B82Y 20/00 257/13 |
| 2012/0236892 A1 | 9/2012 | Johnson et al. |
| 2013/0092896 A1 | 4/2013 | Ledentsov et al. |
| 2014/0191196 A1* | 7/2014 | Cho ................. H01L 31/03520 257/21 |

* cited by examiner

LIGHT-EMITTING DEVICE

REFERENCE TO RELATED APPLICATION

This application is a continuation application of a previously filed U.S. patent application Ser. No. 14/618,037 filed on Feb. 10, 2015, entitled as "LIGHT-EMITTING DEVICE". The disclosures of all references cited herein are incorporated by reference.

TECHNICAL FIELD

The present application generally relates to a light-emitting device, and more particularly to a semiconductor light-emitting device with a prolonged lifetime and higher reliability.

BACKGROUND

Light-emitting diodes (LEDs) are widely used as solid-state light sources. Compared to conventional incandescent light lamps or fluorescent light tubes, light-emitting diodes have advantages such as lower power consumption and longer lifetime, and therefore they gradually replace the conventional light sources and are applied to various fields such as traffic lights, back light modules, street lighting, and medical equipment.

SUMMARY

A light-emitting device is provided. The light-emitting device comprises: a substrate; and an active structure on the substrate, the active structure comprising a well layer and a barrier layer, wherein the well layer comprises multiple different elements of group VA; wherein the substrate has a first intrinsic lattice constant, the well layer has a second intrinsic lattice constant, the barrier layer has a third intrinsic lattice constant, and the third intrinsic lattice constant is between the second intrinsic lattice constant and the first intrinsic lattice constant.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
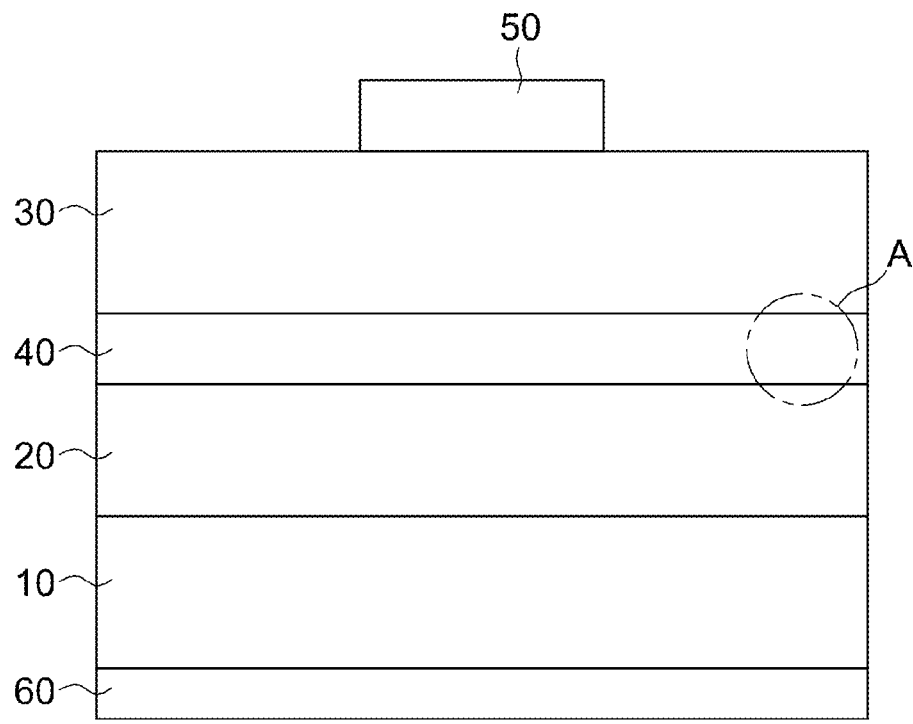
FIG. 1 is a cross-sectional diagram of a light-emitting device in accordance with one embodiment of the present application.
Figure 1:
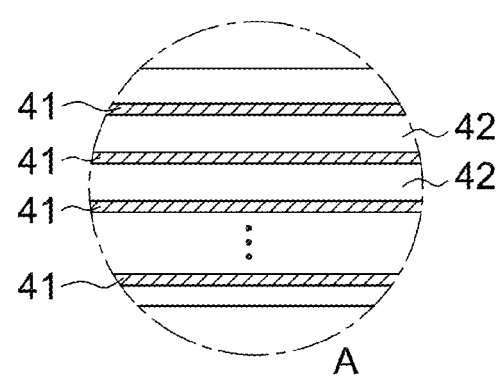

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precisely scaled and components may be exaggerated in view of width, height, length, etc. Herein, the similar or identical reference numerals will denote the similar or identical components throughout the drawings.

In the present application, if not specifically mention, the term "intrinsic lattice constant" means the lattice constant $a_0$ of a substantially unstrained layer.

In the present application, if not specifically mention, the term "lattice constant" means the lattice constant $a_0$ of a strained layer.

In the present application, if not specifically mention, the term "a layer has a residual compressive stress" means the layer directly grown on an underlying layer has an intrinsic lattice constant larger than the lattice constant or the intrinsic lattice constant of the underlying layer. Thus, the layer is strained and compressed to match the lattice constant or the intrinsic lattice constant of the underlying layer. As a result, the lattice constant of the layer is smaller than the intrinsic lattice constant thereof. The "underlying layer" can be a growth substrate or any layer having substantially the same intrinsic lattice constant as that of the growth substrate, or can be a strained layer having substantially the same lattice constant as that of the growth substrate. Particularly, the residual compressive stress can be determined by X-ray Diffraction (XRD).

In the present application, if not specifically mention, the general expression of AlGaAs means $Al_xGa_{(1-x)}As$, wherein $0 \leq x \leq 1$; the general expression of AlInP means $Al_xIn_{(1-x)}P$, wherein $0 \leq x \leq 1$; the general expression of AlGaInP means $(Al_yGa_{(1-y)})_{1-x}In_xP$, wherein $0 \leq x \leq 1$, $0 \leq y \leq 1$; and the general expression of InGaP means $In_xGa_{1-x}P$, wherein $0 \leq x \leq 1$. The content of the element can be adjusted for different purposes, such as matching the lattice constant of the growth substrate or adjusting the dominant wavelength.

FIG. 1 is a cross-sectional diagram of a light-emitting device 1 in accordance with one embodiment of the present application. The light-emitting device 1 comprises a substrate 10, a first semiconductor layer 20 on the substrate 10, a second semiconductor layer 30 on the first semiconductor layer 20, an active structure 40 interposed between the first semiconductor layer 20 and the second semiconductor layer 30, a first electrode 50 on the second semiconductor layer 30, and a second electrode 60 on a side of the substrate 10 opposite to the active structure 40. The active structure 40 comprises alternate well layers 41 and barrier layers 42, wherein each well layer 41 comprises multiple different elements of group VA for adjusting the residual stress of the well layer 41 and for adjusting the difference between the conduction band of the well layer 41 and the conduction band of the adjacent barrier layer 42 ($\Delta E_c$, conduction band offset). The barrier layers 42 have higher band gap than that of the well layers 41. In one embodiment, a difference between the band gap of one of the well layers 41 and the band gap of one of the barrier layers 42 is not less than 0.4 eV, and preferably, is between 0.4 and 0.6 eV, and more preferably, is between 0.5 eV and 0.55 eV. In one embodiment, each of the well layers 41 comprises two different elements of group VA for increasing the difference between the conduction band of the well layer 41 and the conduction band of the adjacent barrier layer 42 so as to improve the ability to confine carriers to the well layers. Preferably, the well layers 41 comprise $In_xGa_{1-x}As_{1-y}P_y$, wherein $x \neq 0$ and $0.001 \leq y \leq 0.1$, and preferably, $0.01 \leq y$ 0.08, and more preferably, $0.04 \leq y \leq 0.07$. In the present embodiment, compared to a well layer 41 comprising $In_xGa_{1-x}As_{1-y}$ that is devoid of phosphorus, the well layer 41 comprising $In_xGa_{1-x}As_{1-y}P_y$ has a higher difference between the conduction band of the well layer 41 and the conduction band of the adjacent barrier layer 42 ($\Delta E_c$) so as to improve the ability to confine carriers to the well layer 41. Besides, compared to a well layer 41 comprising $In_xGa_{1-x}As_{1-y}$ that is devoid of phosphorus, the well layer comprising $In_xGa_{1-x}As_{1-y}P_y$ has a residual stress less than the residual stress of the $In_xGa_{1-x}As_{1-y}$. Thus, the quality of the active structure 40 of the present embodiment is enhanced; therefore, the reliability of the light-emitting device 1 is improved. Specifically, if the phosphorus content of $In_xGa_{1-x}As_{1-y}P_y$ in the well layer 41 is higher than 0.1, i.e. $y>0.1$, the quality of the active structure 40 will deteriorate and therefore results in poor quality of the active structure 40. In one embodiment, the active structure 40 emits a radiation of a dominant wavelength between 750 and 1050 nm both inclusive. In one embodiment, each of the well layers 41 has a thickness less than a critical thickness, which results in a relaxation of the well layer 41 such that the lattice constant of the well layer 41 relaxes to substantially the same as its intrinsic lattice constant. Specifically, the dominant wavelength can be adjusted by the thickness the well layer 41 and the material of the well layer 41. Preferably, each well layer 41 has a thickness between 3 nm and 8 nm. In one embodiment, each of the barrier layers 42 has a thickness less than a critical thickness, which results in a relaxation of the barrier layer 42 such that the lattice constant of the barrier layer 42 relaxes to substantially the same as its intrinsic lattice constant. Preferably, each barrier layer 42 has a thickness between 8 nm and 20 nm.

In one embodiment, the substrate 10 is a growth substrate for epitaxially growing semiconductor layers thereon and has a first intrinsic lattice constant. The well layers 41 each has a second intrinsic lattice constant substantially the same as one another, and the barrier layers 42 each has a third intrinsic lattice constant substantially the same as one another, wherein the second intrinsic lattice constant and the third intrinsic lattice constant are both larger than the first intrinsic lattice constant. Furthermore, the third intrinsic lattice constant is between the first intrinsic lattice constant and the second intrinsic lattice constant. Preferably, the second intrinsic lattice constant is larger than the third intrinsic lattice constant by no more than 0.02 Å, and preferably, no more than 0.015 Å, and more preferably, no more than 0.012 Å. Preferably, the second intrinsic lattice constant is larger than the first intrinsic lattice constant by no more than 0.022 Å, and preferably, no more than 0.018 Å, and more preferably, no more than 0.015 Å. In the present embodiment, the epitaxial quality of the active structure 40 is enhanced by reducing density of defects such as dislocation. Thus, the reliability and the lifetime of the light-emitting device are improved.

In one embodiment, each of the well layers 41 has a residual stress and each of the barrier layers 42 has a residual stress. The residual stresses of the well layers 41 and the barrier layers 42 are all compressive relative to the growth substrate 10. Specifically, each of the well layers 41 has a first residual compressive stress substantially the same as one another, and each of the barrier layers 42 has a second residual compressive stress substantially the same as one another. The first residual compressive stress of each well layer 41 is larger than the second residual compressive stress of each barrier layer 42. In one embodiment, the first residual compressive stress is less than 3000 ppm relative to the growth substrate, and preferably, less than 2800 ppm, and more preferably, less than 2500 ppm. The second residual compressive stress is less than 600 ppm relative to the growth substrate. Preferably, the difference between the first residual compressive stress and the second residual compressive stress is not more than 2500 ppm, and preferably, not more than 2000 ppm.

In the present embodiment, the light-emitting device comprising a well layer comprising $In_xGa_{1-x}As_{1-y}P_y$ undergoes an LED reliability test under the test conditions of an environment temperature being 85° C., relative humidity (RH) being 85%, and a driving current being 1000 mA. After continuation testing under the test condition with duration of 1000 hours, the light output power of the light-emitting device still remains at least 80% of its maximum power during the reliability test. However, the light output power of a light-emitting device comprising a well layer comprising $In_xGa_{1-x}As_{1-y}$ devoid of phosphorus drops to less than 20% of its maximum light output power after the same test.

In one embodiment, the number of the well layers 41 or the barrier layers 42 is larger than ten so as to improve the reliability of the active structure 40. That is, the active structure 40 comprises more than ten barrier layers 42 and more than ten well layers 41. Preferably, the number of the well layers 41 or the barrier layers 42 is between ten and thirty, and more preferably, between fifteen and twenty five.

In one embodiment, the substrate 10 comprises GaAs, the well layers 41 comprise $In_xGa_{1-x}As_{1-y}P_y$, wherein x is between about 0.04 and 0.08, and y is between about 0.05 and 0.07. The barrier layers 42 comprise $Al_zGa_{1-z}As$, wherein z is between about 0.35 and 0.45. The active structure 40 emits an incoherent radiation of a dominant wavelength about 810±10 nm. Specifically, the active structure 40 comprises twenty well layers 41 and twenty-one barrier layers 42. All of the well layers 41 and the barrier layers 42 are undoped so as to improve the reliability of the active structure 40. In one embodiment, the dominant wavelength is about 790±10 nm.

In one of the embodiments, the first semiconductor layer 20 and the second semiconductor layer 30 both have higher band gap than the barrier layers 42. The conductivity type and/or the dopant of the first semiconductor layer 20 are different from that of the second semiconductor layer 30. In the present embodiment, the first semiconductor layer 20 comprises an n-type semiconductor for providing electrons. The second semiconductor layer 30 comprises a p-type semiconductor for providing holes. The first semiconductor layer 20 and the second semiconductor layer 30 comprise a Group III-V semiconductor material, such as AlInP, AlGaInP or AlGaAs. The n-type dopant can be Si or Te. The p type dopant can be C, Zn or Mg. In the present embodiment, the first semiconductor layer 20 and the second semiconductor layer 30 both comprise AlGaAs.

The first electrode 50 and the second electrode 60 are for conducting a current therebetween. The material of the first electrode 50 and the second electrode 60 comprise transparent conductive material or metal material, wherein the transparent conductive material comprises transparent conductive oxide, and wherein the metal material comprises Cu, Sn, Au, Ni, Pt, Al, Ti, Cr, Pb, Cu—Sn, Cu—Zn, Cu—Cd, Sn—Pb—Sb, Sn—Pb—Zn, Ni—Sn, Ni—Co, Au alloy, Au—Cu—Ni—Au or combinations thereof.

Figure 2:
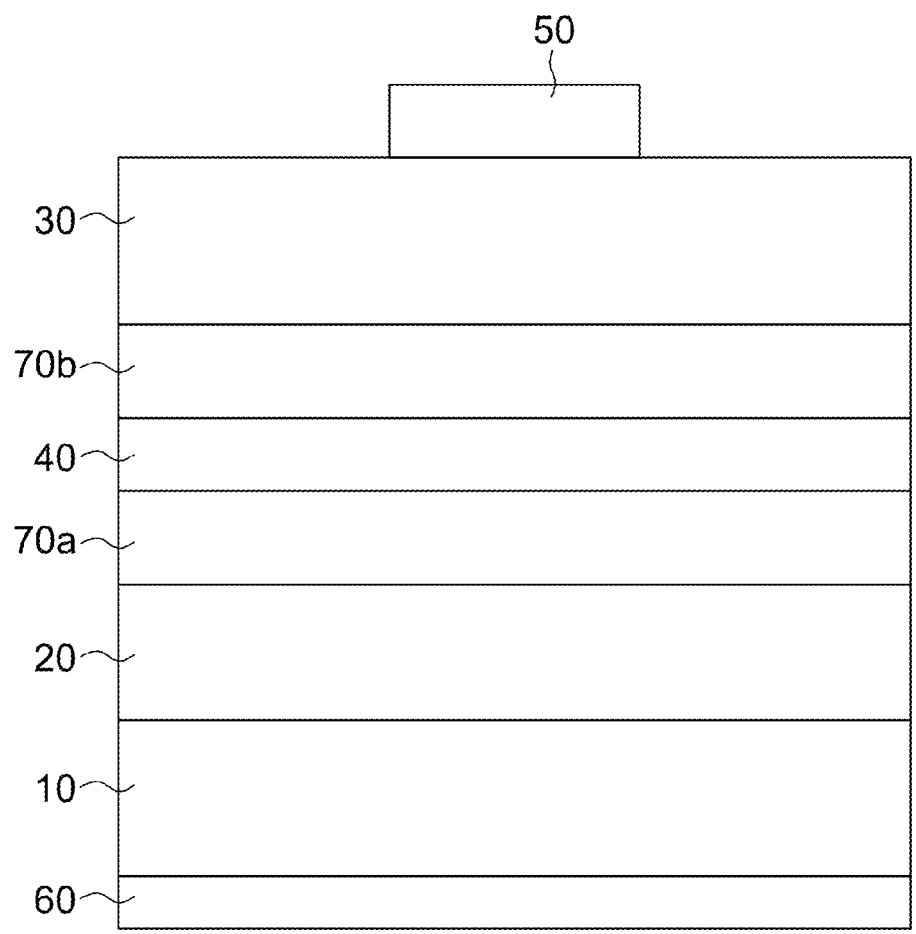
FIG. 2 is a cross-sectional diagram of a light-emitting device in accordance with one embodiment of the present application.

FIG. 2 shows another embodiment of a light-emitting device in accordance with the present disclosure. The light-emitting device 2 comprises substantially the same structure as shown in FIG. 1, and further comprises a first intermediate layer 70a and a second intermediate layer 70b, wherein the first intermediate layer 70a is interposed between the active structure 40 and the first semiconductor layer 20, and the second intermediate layer 70b is interposed between the active structure 40 and the second semiconductor layer 30. The first intermediate layers 70a has a band gap higher than that of the well layers 41 and lower than that of the first semiconductor layer 20. The second intermediate layers 70b has a band gap higher than that of the well layers 41 and lower than that of the second semiconductor layer 30. The first intermediate layer 70a and the second intermediate layer 70b each has a thickness larger than each thickness of the barrier layers 42 so as to improve the reliability of the active structure 40. Preferably, the thickness of the first intermediate layer 70a and/or the thickness of the second intermediate 70b are larger than 200 nm, and more preferably, are between 200 and 2000 nm. In one of the embodiments, the first and the second intermediate layers 70a, 70b, comprise material different from the material of the barrier layers 42. In one embodiment, the first and the second intermediate layers 70a, 70b, comprise the same material. In the present embodiment, the first and the second intermediate layers 70a, 70b, are undoped and have the same material as that of the barrier layers 42. Specifically, the first and the second intermediate layers 70a, 70b, comprise $Al_zGa_{1-z}As$, wherein z is not less than 0.4 for improving the luminous intensity.

Figure 3:
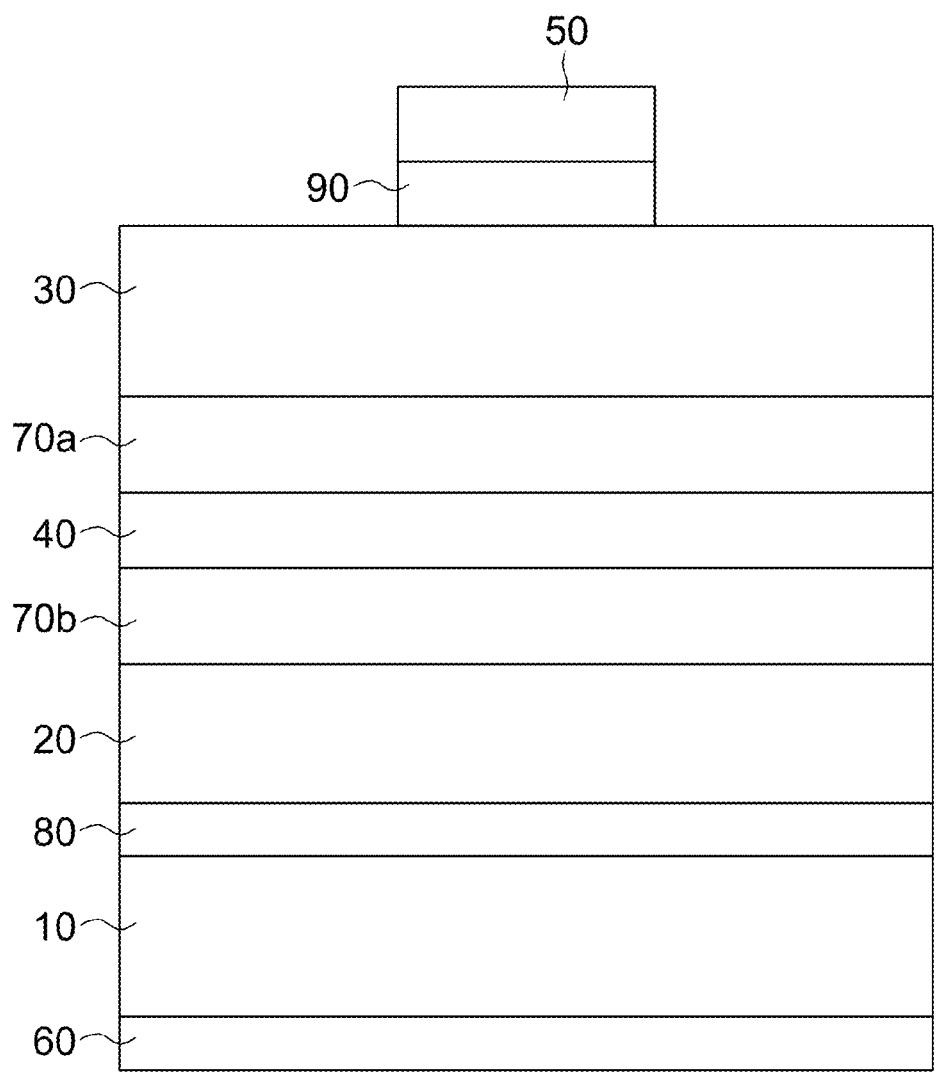
FIG. 3 is a cross-sectional diagram of a light-emitting device in accordance with one embodiment of the present application.

FIG. 3 shows another embodiment of a light-emitting device in accordance with the present disclosure. The light-emitting device 3 comprises substantially the same structure as shown in FIG. 2, and further comprises a first contact layer 80 between the substrate 10 and the first semiconductor layer 20 and comprises a second contact layer 90 between the first electrode 50 and the second semiconductor layer 30. The second electrode 60 is electrically connected to the active structure 40 through the first contact layer 80, which forms an ohmic contact with the first semiconductor layer 20. The first electrode 50 is electrically connected to the active structure 40 through the second contact layer 90, which forms an ohmic contact with the second semiconductor layer 30. In the present embodiment, the first contact layer 80 is an n-type semiconductor and the second contact layer 90 is a p-type semiconductor. The thickness of the first contact layer 80 or the second contact layer 90 is less than 100 nm, and preferably, between 50 and 100 nm both inclusive for reducing light absorption by the second contact layer 90. The doping concentration of the first contact layer 80 or the second contact layer 90 is greater than $10^{18}/cm^3$, and preferably, between $1\times10^{18}/cm^3$ and $5\times10^{19}/cm^3$ both inclusive. The material of the first contact layer 80 comprises a Group III-V semiconductor material, such as GaAs, AlGaAs, InGaP or AlGaInP. The material of the second contact layer 90 comprises a Group III-V semiconductor material, such as GaAs, AlGaAs, InGaP, AlGaInP or GaP.

Figure 4:
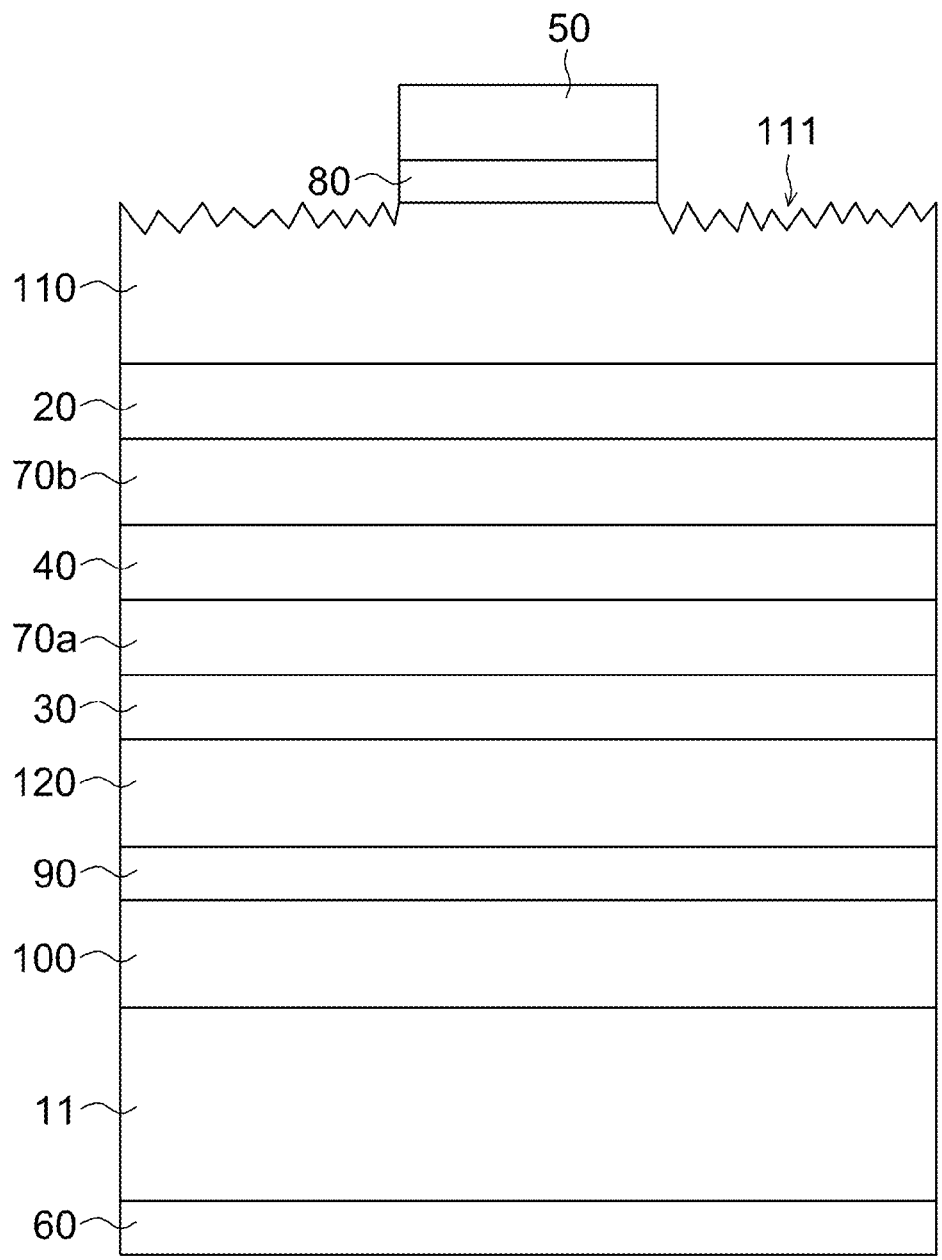
FIG. 4 is a cross-sectional diagram of a light-emitting device in accordance with one embodiment of the present application.
Figure 5:
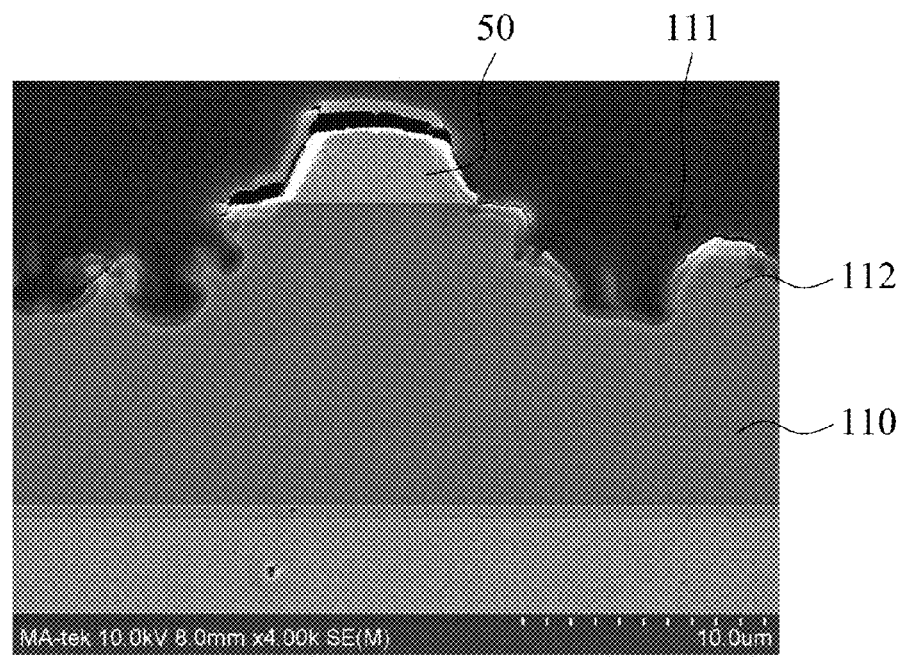
FIG. 5 is an scanning electron microscope (SEM) image showing a magnified detail in FIG. 4.

FIG. 4 shows another embodiment of a light-emitting device in accordance with the present disclosure. The light-emitting device 4 comprises substantially the same structure as shown in FIG. 3 except that the growth substrate of FIG. 3 is removed. Specifically, the light-emitting device 4 further comprises a permanent substrate 11 bonded to the second contact layer 90 by a bonding layer 100 after the growth substrate 10 is removed. Thus, the first semiconductor layer 20 is farther to the permanent substrate 11 than the second semiconductor layer 30. The material of the permanent substrate 11 comprises Si, Ge, Cu, Mo, MoW, AlN or ZnO. The light-emitting device 4 further comprises a first window layer 110 between the first contact layer 80 and the first semiconductor layer 20. The first window layer 110 has a lower doping concentration and larger thickness compared to the first semiconductor layer 20, which comprises an n-type semiconductor for providing electrons in the present embodiment. The first window layer 110 is for spreading current over the active structure 40. In one embodiment, the first window layer 110 has a thickness larger than 2000 nm, and preferably, between 2000 nm and 7000 nm both inclusive for spreading current. Referring to FIG. 5, The first window layer 110 comprises an exposed part 111 not covered by the first electrode 50, where the exposed part 111 is roughened to have hill-like structures 112 so as to reduce the total internal reflection between the first window layer 110 and the ambient environment. The roughness of the exposed part 111 is between 1 μm and 5 μm, and preferably between 1 μm and 3 μm. In one embodiment, the first window layer 110 comprises AlGaInP or AlGaAs. In the present embodiment, the first window layer 110 is an n-type semiconductor and comprises AlGaAs. Specifically, the Al content in the first window layer 110 is smaller than the Al contents in the first and the second intermediate layers 70a, 70b. The bonding layer 100 may comprise multiple sub-layers (not shown). The bonding layer 100 comprises transparent conductive oxide material or metal material. The transparent conductive oxide material comprises indium tin oxide (ITO), indium oxide (InO), tin oxide (SnO), cadmium tin oxide (CTO), antimony tin oxide (ATO), aluminium zinc oxide (AZO), zinc tin oxide (ZTO), gallium doped zinc oxide (GZO), tungsten doped indium oxide (IWO), zinc oxide (ZnO), indium zinc oxide (IZO). The metal material comprises Al, Cr, Cu, Sn, Au, Ni, Ti, Pt, Pb, Zn, Cd, Sb, Co or the alloys thereof.

Referring to FIG. 4, in one embodiment, the light-emitting device further comprises a second window layer 120 between the second contact layer 90 and the second semiconductor layer 30. The second window layer 120 has a lower doping concentration and larger thickness compared to the second semiconductor layer 30 for spreading current over the active structure 40. In one embodiment, the second window layer 120 has a thickness less than the thickness of the first window layer 110, and preferably, the thickness is between 1000 nm and 4000 nm. In one embodiment, the second window layer 120 comprises AlGaInP or AlGaAs. In the present embodiment, the second window layer 120 is a p-type semiconductor and comprises AlGaAs. Specifically, the Al content in the second window layer 120 is smaller than the Al contents in the first and the second intermediate layers 70a, 70b. In the present embodiment, the Al content in the first window layer 110 is the same as the Al content in the second window layer 120.

In one embodiment, the light-emitting device further comprises a reflector (not shown) between the bonding layer 100 and the second contact layer 90 for reflecting the light emitted from the active structure 40. In one embodiment, the reflector comprises a metal layer comprising Cu, Al, Sn, Au, Ag, Pb, Ti, Ni, Pt, W, or the alloys thereof. In one embodiment, the reflector comprises an omni-directional reflector (ODR) having a transparent layer with a refractive index greater than 2.0 and having a metal layer with a reflectivity greater than 90%.

Figure 6:
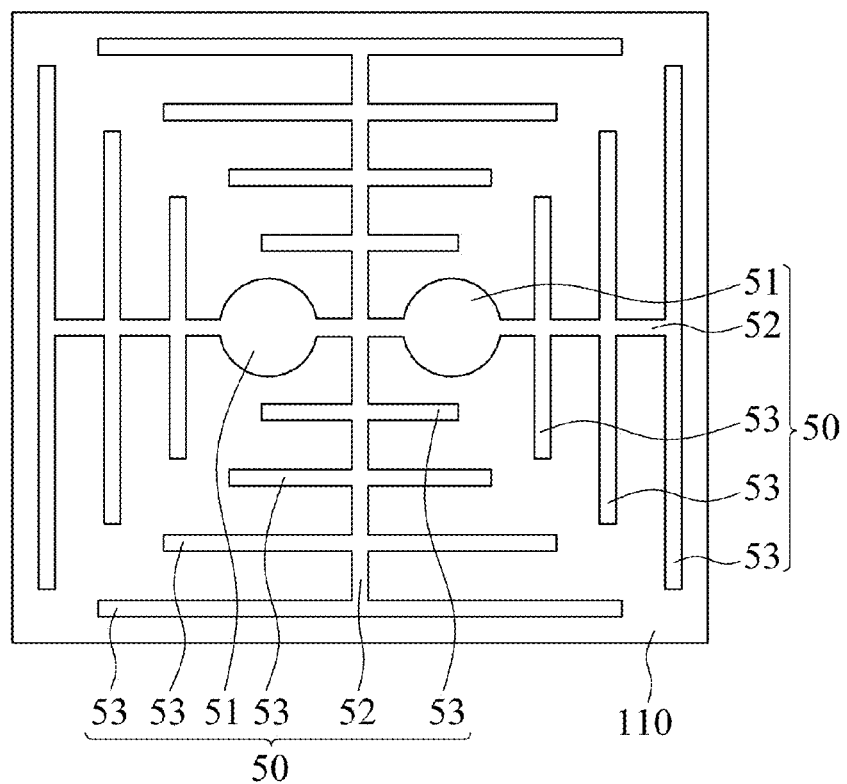
FIG. 6 is a top view of a light-emitting device in accordance with one embodiment of the present application.

FIG. 6 shows another embodiment of a light-emitting device in accordance with the present disclosure. In the present embodiment, the first electrode 50 comprises two pads 51 for bonding to an external device, multiple first extensions 52 radiating from the pads 51 in a direction away from the pads 51, and multiple second extensions 53 crossing the first extensions 52 and forms two symmetric parts along the first extensions 52, wherein each of the second extensions 53 is perpendicular to the first extension 52.

Figure 7:
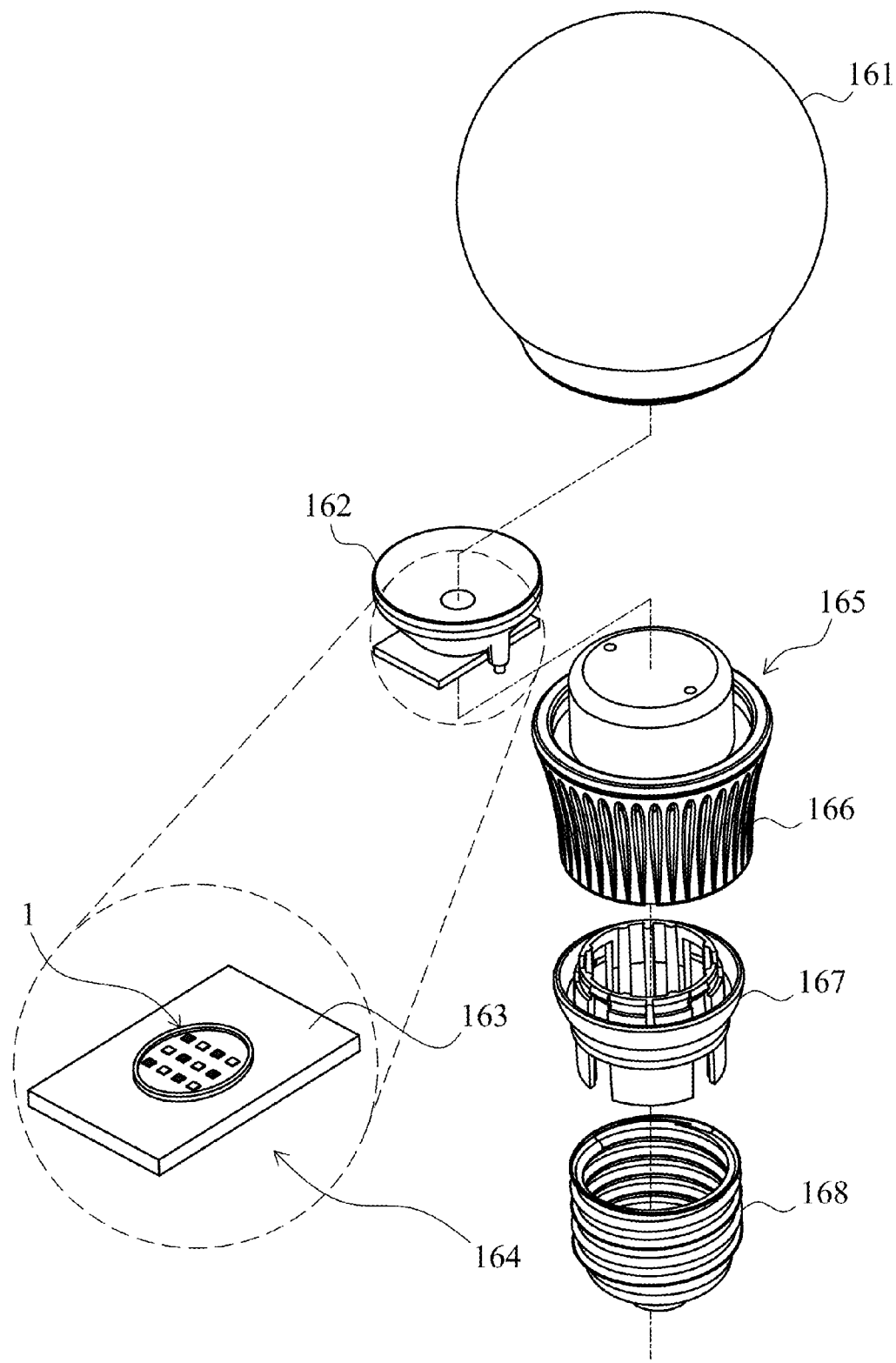
FIG. 7 shows an exploded view of a light bulb in accordance with one of the embodiments of the present application.

The light-emitting devices as mentioned above are able to combine with other downstream structures to form a light bulb. FIG. 7 is an exploded view of a light bulb in accordance with one of the embodiments of the present application. The light bulb comprises a lamp 161, a lens 162 disposed in the lamp 161, a lighting module 164 disposed under the lens 162, a lamp holder 165 comprising a heat sink 166, wherein the lamp holder 165 is used for holding the lighting module 164, a connecting part 167, and an electrical connector 168, wherein the connecting part 167 connects the lamp holder 165 to the electrical connector 168. The lighting module 164 comprises a carrier 163 and multiple light-emitting devices 1 of any one of the embodiments as mentioned above, wherein the multiple light-emitting devices 1 are on the carrier 163.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting device, comprising:
   a substrate; and
   an active structure on the substrate, the active structure comprising alternate well layers and barrier layers, wherein each of the well layers comprises multiple different elements of group VA;
   wherein the substrate has a first intrinsic lattice constant, each well layer has a second intrinsic lattice constant, each barrier layer has a third intrinsic lattice constant, and the third intrinsic lattice constant is between the second intrinsic lattice constant and the first intrinsic lattice constant, wherein one of the well layers has a band gap and one of the barrier layers has a band gap, and a difference between the band gap of the well layer and the band gap of the barrier layer is not less than 0.4 eV.

2. The light-emitting device according to claim 1, wherein one of the well layers and one of the barrier layers each has a residual compressive stress, and the residual compressive stress of the well layer is larger than the residual compressive stress of the barrier layer.

3. The light-emitting device according to claim 2, wherein the difference between the residual compressive stress of the well layer and the residual compressive stress of the barrier layer is not more than 2500 ppm.

4. The light-emitting device according to claim 2, wherein the difference between the residual compressive stress of the well layer and the residual compressive stress of the barrier layer is not more than 2000 ppm.

5. The light-emitting device according to claim 1, further comprising a first semiconductor layer of first conductivity type and a second semiconductor layer of second conductivity type sandwiching the active structure, and further comprising an intermediate layer interposed between the first semiconductor layer and the active structure, wherein the first semiconductor layer has a first band gap, the second semiconductor layer has a second band gap, the well layer has a third band gap, and the intermediate layer has a fourth band gap, wherein the first band gap and the second band gap are both larger than the fourth band gap, and the fourth band gap is larger than the third band gap, and the intermediate layer has a thickness larger than a thickness of the barrier layer.

6. The light-emitting device according to claim 5, further comprising a first window layer on the first semiconductor layer, wherein the intermediate layer comprises $Al_{z1}Ga_{1-z1}As$, the first window layer comprises $Al_{z2}Ga_{1-z2}As$, and $z_1 > z_2$.

7. The light-emitting device according to claim 5, wherein the intermediate layer comprises $Al_{z1}Ga_{1-z1}As$, the first semiconductor layer comprises $Al_{z3}Ga_{1-z3}As$, and $0.4 \leq z_1 \leq z_3$.

8. The light-emitting device according to claim 5, wherein the intermediate layer has a thickness not less than 200 nm.

9. The light-emitting device according to claim 1, wherein one of the well layers and/or one of the barrier layers is undoped.

10. The light-emitting device according to claim 1, wherein the second intrinsic lattice constant is larger than the third intrinsic lattice constant by no more than 0.02 Å.

11. The light-emitting device according to claim 1, wherein the second intrinsic lattice constant is larger than the third intrinsic lattice constant by no more than 0.015 Å.

12. The light-emitting device according to claim 1, wherein the second intrinsic lattice constant is larger than the first intrinsic lattice constant by no more than 0.022 Å.

13. The light-emitting device according to claim 1, wherein the second intrinsic lattice constant is larger than the first intrinsic lattice constant by no more than 0.018 Å.

14. The light-emitting device according to claim 1, wherein one of the well layers comprises $In_xGa_{1-x}As_{1-y}P_y$, $x \neq 0$, $0.001 \leq y \leq 0.1$ and $z \neq 0$.

15. The light-emitting device according to claim 1, wherein the number of the well layers or the barrier layers is between ten and thirty.

16. The light-emitting device according to claim 1, wherein the active structure emits a radiation having a dominant wavelength between 750 nm and 1050 nm both inclusive.

17. A light-emitting device, comprising:
    an active structure comprising alternate well layers and barrier layers, wherein each of the well layers comprises $In_xGa_{1-x}As_{1-y}P_y$ and each of the barrier layers comprises $Al_zGa_{1-z}As$, wherein $x \neq 0$, $0.001 \leq y \leq 0.1$ and $z \neq 0$, wherein one of the well layers has a band gap and one of the barrier layers has a band gap, and a difference between the band gap of the well layer and the band gap of the barrier layer is not less than 0.4 eV.

18. The light-emitting device according to claim 17, further comprising a first semiconductor layer of first conductivity type and a second semiconductor layer of second conductivity type sandwiching the active structure, and further comprising an intermediate layer interposed between the first semiconductor layer and the active structure, wherein the first semiconductor layer has a first band gap, the second semiconductor layer has a second band gap, the well layer has a third band gap, and the intermediate layer has a fourth band gap, wherein the first band gap and the second band gap are both larger than the fourth band gap, and the fourth band gap is larger than the third band gap, and the intermediate layer has a thickness larger than a thickness of the barrier layer.

19. The light-emitting device according to claim 18, wherein the intermediate layer comprises $Al_{z1}Ga_{1-z1}As$, the first semiconductor layer comprises $Al_{z2}Ga_{1-z2}As$, and $0.4 \leq z_1 \leq z_2$.

20. The light-emitting device according to claim 17, wherein $0.01 \leq y \leq 0.08$.

* * * * *